(12) United States Patent
Albarede et al.

(10) Patent No.: US 8,473,089 B2
(45) Date of Patent: Jun. 25, 2013

(54) METHODS AND APPARATUS FOR PREDICTIVE PREVENTIVE MAINTENANCE OF PROCESSING CHAMBERS

(75) Inventors: Luc Albarede, Fremont, CA (US); Eric Pape, Newark, CA (US); Vijayakumar C Venugopal, Berkeley, CA (US); Brian D Choi, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 251 days.

(21) Appl. No.: 12/826,575

(22) Filed: Jun. 29, 2010

(65) Prior Publication Data

US 2010/0332201 A1 Dec. 30, 2010

Related U.S. Application Data

(63) Continuation-in-part of application No. 12/555,674, filed on Sep. 8, 2009.

(60) Provisional application No. 61/222,102, filed on Jun. 30, 2009, provisional application No. 61/222,024, filed on Jun. 30, 2009.

(51) Int. Cl.
*G06F 19/00* (2011.01)
(52) U.S. Cl.
USPC .................. 700/121; 702/2; 702/16; 714/11
(58) Field of Classification Search
USPC ............................ 700/121; 702/2, 16; 714/11
See application file for complete search history.

(56) References Cited

U.S. PATENT DOCUMENTS

| 4,310,880 A | 1/1982 | Gehman |
| 4,443,848 A | 4/1984 | Gehman |
| 4,659,413 A | 4/1987 | Davis et al. |
| 4,661,196 A | 4/1987 | Hockersmith et al. |
| 4,785,399 A | 11/1988 | Evans et al. |
| 5,206,184 A | 4/1993 | Allen et al. |
| 5,272,872 A | 12/1993 | Grutter et al. |

(Continued)

FOREIGN PATENT DOCUMENTS

| JP | 2003-197609 A | 7/2003 |
| KR | 10-2005-0030342 A | 3/2005 |
| KR | 10-2008-0006750 A | 1/2008 |
| WO | WO-2004/102642 A2 | 11/2004 |

OTHER PUBLICATIONS

"International Search Report", Issued in PCT Application No. PCT/US2010/0210477; Mailing Date: Feb. 8, 2011.

(Continued)

*Primary Examiner* — Michael D Masinick
(74) *Attorney, Agent, or Firm* — IPSG, P.C. Intellectual Property Law

(57) ABSTRACT

A method for assessing health status of a processing chamber is provided. The method includes executing a recipe. The method also includes receiving processing data from a set of sensors during execution of the recipe. The method further includes analyzing the processing data utilizing a set of multi-variate predictive models. The method yet also includes generating a set of component wear data values. The method yet further includes comparing the set of component wear data values against a set of useful life threshold ranges. The method moreover includes generating a warning if the set of component wear data values is outside of the set of useful life threshold ranges.

18 Claims, 5 Drawing Sheets

U.S. PATENT DOCUMENTS

| | | | |
|---|---|---|---|
| 5,450,205 A | 9/1995 | Sawin et al. | |
| 5,479,340 A | 12/1995 | Fox et al. | |
| 5,640,518 A | 6/1997 | Muhich et al. | |
| 5,971,591 A | 10/1999 | Vona et al. | |
| 5,986,747 A | 11/1999 | Moran | |
| 6,021,215 A | 2/2000 | Kornblit et al. | |
| 6,077,386 A | 6/2000 | Smith, Jr. et al. | |
| 6,192,287 B1 | 2/2001 | Solomon et al. | |
| 6,246,481 B1 | 6/2001 | Hill | |
| 6,253,113 B1* | 6/2001 | Lu | 700/28 |
| 6,318,384 B1 | 11/2001 | Khan | |
| 6,332,961 B1 | 12/2001 | Johnson et al. | |
| 6,343,251 B1* | 1/2002 | Herron et al. | 701/100 |
| 6,377,210 B1 | 4/2002 | Moore | |
| 6,420,194 B1 | 7/2002 | Reitman | |
| 6,553,277 B1 | 4/2003 | Yagisawa et al. | |
| 6,567,718 B1* | 5/2003 | Campbell et al. | 700/121 |
| 6,665,576 B2 | 12/2003 | Hayashi | |
| 6,745,096 B2 | 6/2004 | Yamamoto et al. | |
| 6,805,810 B2 | 10/2004 | Smith, Jr. et al. | |
| 6,813,534 B2 | 11/2004 | Sui et al. | |
| 6,821,794 B2 | 11/2004 | Laursen et al. | |
| 6,824,627 B2 | 11/2004 | Dhindsa et al. | |
| 6,879,867 B2 | 4/2005 | Tanaka et al. | |
| 6,895,293 B2 | 5/2005 | Reiss et al. | |
| 6,902,646 B2 | 6/2005 | Mahoney et al. | |
| 6,969,619 B1 | 11/2005 | Winniczek | |
| 7,010,374 B2 | 3/2006 | Tanaka et al. | |
| 7,016,811 B2 | 3/2006 | Peck et al. | |
| 7,050,873 B1* | 5/2006 | Discenzo | 700/99 |
| 7,058,467 B2 | 6/2006 | Tanaka et al. | |
| 7,062,411 B2 | 6/2006 | Hopkins et al. | |
| 7,082,345 B2 | 7/2006 | Shanmugasundram et al. | |
| 7,103,443 B2 | 9/2006 | Strang | |
| 7,107,115 B2 | 9/2006 | Tanaka et al. | |
| 7,113,838 B2 | 9/2006 | Funk et al. | |
| 7,146,237 B2 | 12/2006 | Lev-Ami et al. | |
| 7,158,848 B2 | 1/2007 | Tanaka et al. | |
| 7,167,766 B2 | 1/2007 | Lam et al. | |
| 7,217,336 B2 | 5/2007 | Strang | |
| 7,257,457 B2 | 8/2007 | Imai et al. | |
| 7,356,580 B1 | 4/2008 | Huang et al. | |
| 7,373,216 B1 | 5/2008 | Winkler et al. | |
| 7,376,479 B2 | 5/2008 | Tanaka et al. | |
| 7,413,672 B1 | 8/2008 | Keil et al. | |
| 7,477,960 B2 | 1/2009 | Willis et al. | |
| 7,493,185 B2 | 2/2009 | Cheng et al. | |
| 7,499,897 B2* | 3/2009 | Pinto et al. | 706/46 |
| 7,531,368 B2 | 5/2009 | Winkler et al. | |
| 7,565,220 B2 | 7/2009 | Huang et al. | |
| 7,620,511 B2 | 11/2009 | Shannon et al. | |
| 7,647,237 B2 | 1/2010 | Malave et al. | |
| 7,668,615 B2 | 2/2010 | Goff et al. | |
| 7,672,747 B2 | 3/2010 | Huang et al. | |
| 7,676,295 B2 | 3/2010 | Weetman | |
| 7,713,758 B2 | 5/2010 | Yamashita et al. | |
| 7,729,795 B2 | 6/2010 | Winkler et al. | |
| 7,793,162 B2 | 9/2010 | Mock et al. | |
| 7,805,639 B2 | 9/2010 | Mock et al. | |
| 7,829,468 B2 | 11/2010 | Keil et al. | |
| 7,835,814 B2 | 11/2010 | Mock et al. | |
| 7,842,519 B2 | 11/2010 | Winkler et al. | |
| 7,848,898 B2 | 12/2010 | Shannon et al. | |
| 7,864,502 B2 | 1/2011 | Boyd et al. | |
| 7,886,046 B1 | 2/2011 | Zeitoun et al. | |
| 7,939,450 B2 | 5/2011 | Yamashita et al. | |
| 7,967,995 B2 | 6/2011 | Funk et al. | |
| 8,000,827 B2 | 8/2011 | Weetman et al. | |
| 8,005,562 B2 | 8/2011 | Baek et al. | |
| 8,014,991 B2 | 9/2011 | Mitrovic et al. | |
| 8,032,348 B2 | 10/2011 | Mitrovic et al. | |
| 8,036,869 B2 | 10/2011 | Strang et al. | |
| 8,050,900 B2 | 11/2011 | Mitrovic et al. | |
| 8,073,667 B2 | 12/2011 | Strang et al. | |
| 8,140,719 B2 | 3/2012 | Lauterbach et al. | |
| 2002/0177917 A1 | 11/2002 | Polla et al. | |
| 2003/0087459 A1 | 5/2003 | Laursen et al. | |
| 2003/0223055 A1 | 12/2003 | Agarwal et al. | |
| 2003/0226821 A1 | 12/2003 | Huang et al. | |
| 2004/0004708 A1 | 1/2004 | Willis | |
| 2004/0031052 A1 | 2/2004 | Wannamaker et al. | |
| 2004/0055868 A1 | 3/2004 | O'Leary et al. | |
| 2004/0117054 A1 | 6/2004 | Gotkis et al. | |
| 2004/0175880 A1 | 9/2004 | Tanaka et al. | |
| 2004/0254762 A1 | 12/2004 | Hopkins et al. | |
| 2005/0055175 A1 | 3/2005 | Jahns et al. | |
| 2005/0071034 A1 | 3/2005 | Mitrovic | |
| 2005/0071035 A1 | 3/2005 | Strang | |
| 2005/0071036 A1 | 3/2005 | Mitrovic | |
| 2005/0071037 A1 | 3/2005 | Strang | |
| 2005/0071038 A1 | 3/2005 | Strang | |
| 2005/0071039 A1 | 3/2005 | Mitrovic | |
| 2005/0084988 A1 | 4/2005 | Huang et al. | |
| 2005/0130125 A1 | 6/2005 | Zagyansky | |
| 2005/0159911 A1 | 7/2005 | Funk et al. | |
| 2005/0171627 A1 | 8/2005 | Funk et al. | |
| 2005/0234574 A1 | 10/2005 | Lam et al. | |
| 2006/0049831 A1 | 3/2006 | Anwar et al. | |
| 2006/0144335 A1 | 7/2006 | Lee et al. | |
| 2006/0171848 A1 | 8/2006 | Roche et al. | |
| 2006/0180570 A1 | 8/2006 | Mahoney | |
| 2006/0184264 A1 | 8/2006 | Willis et al. | |
| 2006/0287753 A1 | 12/2006 | Plumhoff | |
| 2007/0050076 A1 | 3/2007 | Yamazaki et al. | |
| 2007/0110043 A1 | 5/2007 | Girard | |
| 2007/0226540 A1 | 9/2007 | Konieczny | |
| 2008/0082579 A1 | 4/2008 | Huang et al. | |
| 2008/0082653 A1 | 4/2008 | Huang et al. | |
| 2008/0208487 A1* | 8/2008 | Goebel et al. | 702/34 |
| 2008/0243988 A1 | 10/2008 | Huang et al. | |
| 2009/0216920 A1 | 8/2009 | Lauterbach et al. | |
| 2009/0242513 A1 | 10/2009 | Funk et al. | |
| 2010/0125360 A1 | 5/2010 | Huang et al. | |
| 2010/0198556 A1 | 8/2010 | Kost | |
| 2010/0332013 A1 | 12/2010 | Choi et al. | |
| 2010/0332014 A1 | 12/2010 | Albarede et al. | |
| 2012/0101622 A1 | 4/2012 | Yun et al. | |

OTHER PUBLICATIONS

"Written Opinion", issued in PCT Application No. PCT/US2010/040477; Mailing Date; Feb. 8, 2011.

"Non Final Office Action"; U.S. Appl. No. 12/555,674, Mailing Date: Dec. 23, 2011.

"International Search Report", Issued in PCT Application No. PCT/US2010/040456; Mailing Date: Jan. 21, 2011.

"Written Opinion", Issued in PCT Application No. PCT/US2010/040456; Mailing Date: Jan. 21, 2011.

"International Search Report", Issued in PCT Application No. PCT/US2010/040465; Mailing Date: Jan. 17, 2011.

"Written Opinion", Issued in PCT Application No. PCT/US2010/040465; Mailing Date: Jan. 17, 2011.

"International Search Report", Issued in PCT Application No. PCT/US2010/040468; Mailing Date: Jan. 17, 2011.

"Written Opinion", Issued in PCT Application No. PCT/US2010/040468; Mailing Date: Jan. 17, 2011.

"International Search Report", Issued in PCT Application No. PCT/US2010/042933; Mailing Date: Feb. 18, 2011.

"Written Opinion", Issued in PCT Application No. PCT/US2010/042933; Mailing Date: Feb. 18, 2011.

"International Search Report", Issued in PCT Application No. PCT/US2010/040478: Mailing Date: Dec. 28, 2010.

"Written Opinion", Issued in PCT Application No. PCT/US2010/040478; Mailing Date: Dec. 28, 2010.

"International Preliminary Report on Patentability", PCT Application No. PCT/US2010/042933, Mailing Date: Jan. 12, 2012.

"International Preliminary Report on Patentability", PCT Application No. PCT/US2010/040456, Mailing Date: Jan. 12, 2012.

"International Preliminary Report on Patentability", PCT Application No. PCT/US2010/040465, Mailing Date: Jan. 12, 2012.

"International Preliminary Report on Patentability", PCT Application No. PCT/U62010/040468, Mailing Date: Jan. 12, 2012.

"International Preliminary Report on Patentability", PCT Application No. PCT/US2010/040477, Mailing Date: Jan. 12, 2012.

"International Preliminary Report on Patentability", PCT Application No. PCT/US2010/040478, Mailing Date: Jan. 12, 2012.

"Non Final Office Action", U.S. Appl. No. 12/826,564; Mailing Date: Aug. 30, 2012.

"Non Final Office Action", U.S. Appl. No. 12/555,674, Mailing Date: Sep. 4, 2012.

* cited by examiner

METHODS AND APPARATUS FOR PREDICTIVE PREVENTIVE MAINTENANCE OF PROCESSING CHAMBERS

CROSS REFERENCE TO RELATED APPLICATIONS

The present invention claims priority under 35 U.S.C. 119 (e) to a commonly owned provisionally filed patent application entitled "Methods and Systems for Advance Equipment Control/Advance Process Control for Plasma Processing Tools," U.S. Application No. 61/222,102, filed on Jun. 30, 2009, by inventors Venugopal et al., all of which is incorporated herein by reference.

This continuation-in-part application claims priority under 37 CFR 1.53(b) of and claims the benefit under 35 U.S.C. §120 to a commonly assigned patent application entitled "Arrangement for Identifying Uncontrolled Events of the Process Module Level and Methods Thereof," by Huang et al., application Ser. No. 12/555,674 filed on Sep. 8, 2009, which is related to and claims priority under 35 U.S.C. §119 (e) to a commonly assigned provisional patent application entitled "Arrangement for Identifying Uncontrolled Events at the Process Module Level and Methods Thereof," by Huang et al., Application Ser. No. 61/222,024, filed on Jun. 30, 2009, all of which is incorporated by reference herein.

BACKGROUND OF THE INVENTION

Advances in plasma processing have resulted in tremendous growth in the semiconductor industry. A plasma processing system may be comprised of many components. For ease of discussion, the term "component" will be used to refer to an atomic or a multi-part assembly in a plasma processing system. Thus, a component may be as simple as an edge ring, or may be as complex as the entire process module. A multi-part component (such as a process module) may be formed from other multi-part components (such as a vacuum system, a gas system, a power supply system, etc), which may in turn be formed from other multi-part or atomic components.

Over time, one or more components may wear out. Those skilled in the art are aware that worn-out components may cause damage to the chamber and/or damage to the substrate if the worn-out components are not fixed/replaced. One method of identifying which component may have to be replaced may include using a fixed schedule of component replacement. In other words, a useful life period may be identified a priori for each component. The usage of each component may be tracked and when the component reaches the end of its useful life (as predetermined by the fixed useful life schedule), the component may be replaced.

Unfortunately, the method of predetermining the useful life of a component for replace/repair purposes has its limitations. First, the useful life of a component may vary depending upon the environment surrounding the component. In an example, component 1 may be employed in a processing chamber that may experience a different process recipe or mixture of process recipes than component 2. Thus, component 1 may wear out before component 2 even though both components may be of the same make and model.

Thus, with the predetermined useful life method, unnecessary costs associated with taking a processing chamber offline and replacing a component may be incurred even though the component's useful life may not have actually ended. In addition, the predetermined useful life method may not account for the possibility of the component prematurely wearing out before the expiration of its predetermined theoretical useful life. In many instances, the component's deteriorating condition may result in damaged substrates and/or even damage to the chamber and other components within the processing chamber.

One method for determining component wear may involve tracking the evolution of a single parameter, a so-called uni-variate mode. In an example, the health of a component may be monitored by tracking a single parameter measurable by some sensors. For example, the RF bias voltage may be tracked. If the RF bias voltage is above a predetermined threshold, the edge ring, for example, may be deemed to have reached the end of its useful life.

Unfortunately, the uni-variate method also has its limitations. As aforementioned, a given component is monitored by tracking a single parameter. However, the parameter may be affected by influences other than the condition of the given component. In an example, to monitor the condition of an edge ring, the RF bias voltage may be monitored. However, the value of the RF bias voltage may be affected by influences other than just the edge ring condition. For example, the RF bias voltage may also be affected by the deposition on the chamber wall. Thus, when a high RF bias voltage is identified, the high RF bias voltage value may not necessarily be an indication that a problem may exist with the edge ring. Instead, a problem may exist but further analysis may be required before the cause of the problem can be identified.

Another problem with the uni-variate method is that the uni-variate method can be a "go/no-go" method. In other words, the uni-variate method is usually utilized to identify when a fault condition may exist to enable the component to be replaced. However, the uni-variate method may be unable to assist in predicting when (instead of whether) the component may need to be replaced. In other words, in such a scenario the uni-variate method may, at best, be employed to identify a problem and not predict when a problem (e.g., end of useful life) may occur.

Consequently, when a component, such as the edge ring, does actually wear out, a replacement component may not be immediately available. As a result, the processing chamber may have to remain offline until a new edge ring, for example, can be obtained for replacement. Of course, the manufacturing company may opt to always have replacements (such as an edge ring) available. This method of always carrying spare components can become expensive since the manufacturing company has to allocate resources (money and storage space) to have components available even if the components are still in proper working condition.

Another method for identifying component wear may include utilizing a monitoring patch. A monitoring patch is an item that may be placed on a component. The monitoring patch may be placed close to the surface of the component or may be embedded into the component. A component may be considered to be at the end of its useful life if the monitoring patch has worn out, for example. If the monitoringpatch is embedded, the component is considered to be at the end of its useful life when the monitoring patch becomes visible, for example.

There are several limitations with the monitoring patch method. First, a monitoring patch is required for each component that is to be monitored. Thus, if 100 components need to be monitored, a monitoring patch has to be placed on each component. The monitoring patch method can become very expensive and time consuming to implement and monitor depending upon the number of components that may be monitored.

Also, the utilization of a monitoring patch may increase the risk of contamination. The monitoring patch is a foreign object that has to be placed within the processing chamber. As aforementioned, the condition of the processing chamber has to be tightly controlled in order to prevent damage to the chamber and/or damage to the substrate. By introducing one or more monitoring patches into the processing chamber, the processing environment may be altered. In addition, the degree with which the processing environment may have changed due to the existence of the monitoring patches within the processing chamber may be unknown or difficult to measure.

Another limitation of the monitoring patch method is that by placing a monitoring patch onto a component, the mechanical functionality of the component may be compromised. In other words, the mechanical behavior of an edge ring may change with a monitoring patch embedded in the ring. Unfortunately, the extent at which the patch may have altered the functionality of the component may vary since each component and/or each patch may be unique.

Accordingly, a non-invasive method for predicting component wear is desirable.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
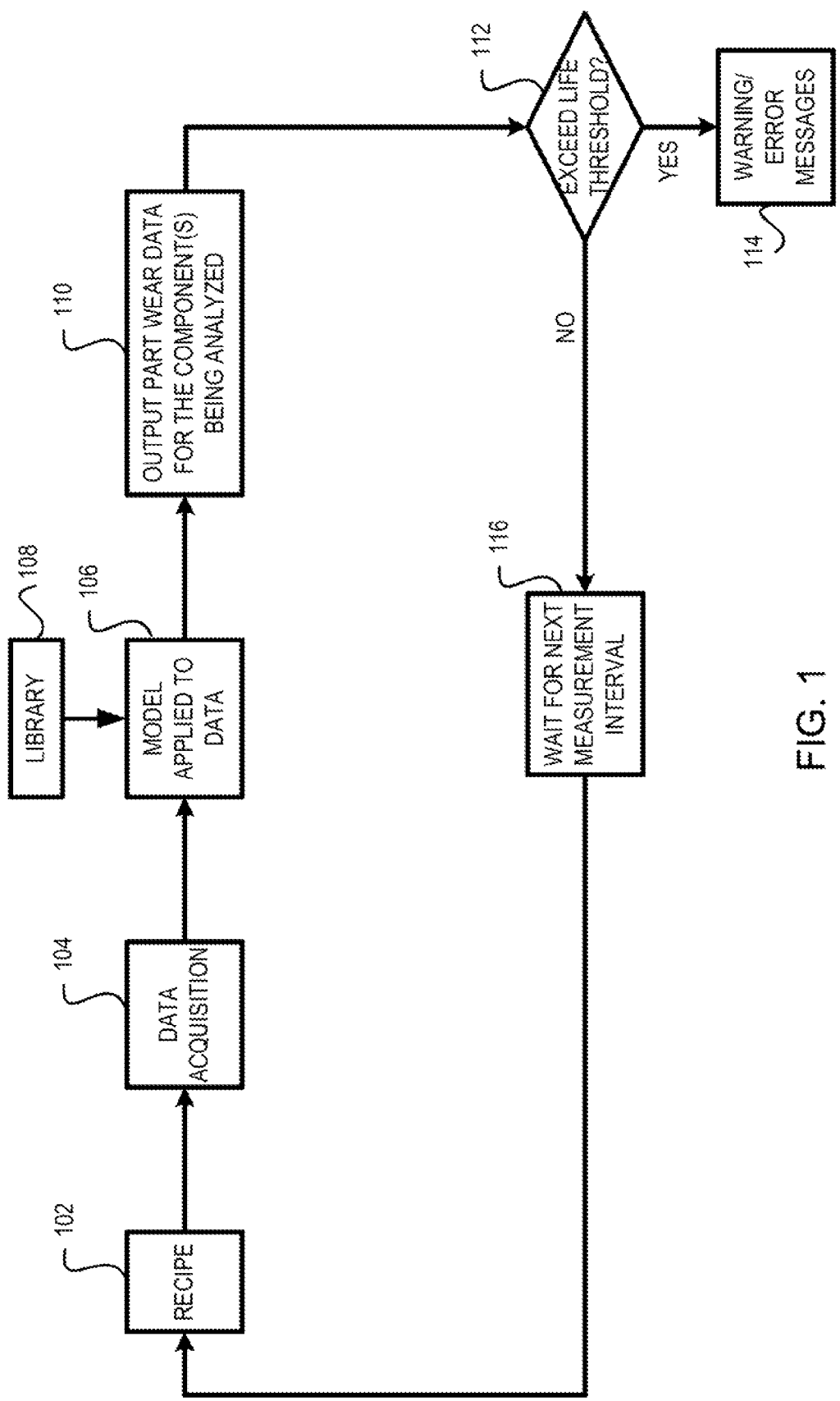
FIG. 1 shows, in an embodiment of the invention, a simple now chart for applying a single multi-variate predictive model for qualifying a component.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Although the statistical model will be discussed in some details to facilitate the understanding of the overall technique, this invention relates to the prediction of part wear and how such prediction may be employed in preventive maintenance. The particular model that may be employed in performing said prediction may depend upon the chambers or parts involved. However, it is understood that any model (e.g., statistical model, electrical model, plasma model, hybrid model, a combination of models, etc.) may be employed and usage of a particular model for a particular chamber, particular part and/or particular recipe is within the scope of one with skills in the ordinary art.

In embodiments of the invention, methods are provided for assessing a chamber health status. Embodiments of the invention include performing a chamber health index test. As discussed herein a chamber health index test refers to a test that may determine and/or predict the health of a set of components (e.g., set of consumable parts) within a processing chamber. In other words, a chamber health index test may be employed to determine and/or predict when a component may be reaching the end of its useful life.

In an embodiment of the invention, methods are provided for evaluating a chamber health status. In an example, one or more multi-variate predictive models may be constructed to perform a chamber health index test within a processing chamber. Unlike the prior art, the predictive model(s) may be based on multiple parameters instead of a single parameter. As a result, the chamber health index test may be executed to not only identify when a component may have worn out but also for making a prediction about the remaining useful life of the component.

In an embodiment, construction of a set of robust predictive models (e.g., set of multi-variate predictive models) may be based on data collected at various points during a preventive maintenance cycle, also referred to herein as a wet clean cycle. The data may be collected at least at the beginning and at the end of a wet clean cycle in order to eliminate noise within the data set that may be related to the condition of the chamber instead of the actual component itself. In an embodiment of the invention, construction of a set of robust predictive models may also be based on data collected across multiple chambers. Data are collected across chambers in order to also eliminate noise that may be associated with chamber conditions that are unique to a specific chamber instead of the condition of a component.

Once the set of multi-variate predictive models has been constructed, the set of multi-variate predictive models may be applied in a production environment for qualifying the condition of the chamber and its components. Embodiments of the invention provide for methods for qualifying a component using a single multi-variate predictive model. In other words, a single multi-variate predictive model may be employed for qualifying a single component. In an embodiment of the invention, methods are provided for applying more than one multi-variate predictive model for predicting the wear of multiple parts and in determining a chamber heath index.

In an embodiment, a non-plasma test (NPT) may be utilized in combination with a chamber health index test. In one embodiment, the NPT may be utilized to gauge when a chamber health index test may need to be executed. As discussed herein, a non-plasma test refers to a test that may be executed by applying low power at one or more predefined frequencies to the processing chamber and not igniting a plasma. Even though a plasma is not formed during the test, sufficient data is provided to approximate the condition of the processing chamber. Since the NPT is a fairly quick and inexpensive test to run, the NPT may be employed as a precursor to a chamber health index test. In one embodiment of the invention, the NPT may also be utilized to validate a chamber health index test. In an embodiment, the data from the NPT may be correlated against the data collected during a chamber health index test for validation purposes.

The features and advantages of the present invention may be better understood with reference to the figures and discussions that follow.

As aforementioned, a chamber health status may be employed to determine when maintenance is required. To assess the chamber health status, especially the consumable parts, a chamber health index test may be performed. The chamber health index test may be performed based on a model-based approach.

FIG. 1-FIG. 4 show, in embodiments of the invention, different methods for applying one or more multi-variate predictive models in qualifying a set of components.

FIG. 1 shows, in an embodiment of the invention, a simple flow chart for applying a single multi-variate predictive model for qualifying a set of components.

At a first step 102, a recipe is executed in a processing chamber. The recipe may be either a client-specific recipe, a WAC recipe, or a non-client specific recipe.

As discussed herein, a client-specific recipe is a recipe that may be tailored specifically for a specific manufacturing company. In an example, a client-specific recipe may be an actual production-ready process recipe that is unique to a specific manufacturing company. In one embodiment, the ability to utilize client-specific recipes enables the user (e.g., process engineer) to construct a multi-variate model specific for his/her needs.

As discussed herein, a non-client specific recipe refers to a recipe that may be designed to maximize sensitivity to the wear of a specific consumable part. In an example, a non-client specific recipe may be a recipe that may be configured for analyzing specific conditions of a plasma processing system. A non-client specific recipe may be utilized by any manufacturing company that may have processing chambers that have similar chamber set-ups as specified by the non-client specific recipe.

Another recipe that may be employed is a waferless autoclean (WAC) recipe. The WAC recipe may be run after a production run. The WAC recipe is usually not chamber specific.

The type of recipes that may be executed may depend upon the multi-variate predictive model. In an example, if the multi-variate predictive model has been constructed using a client-specific recipe then the recipe that may be employed to utilize the multi-variate model may also be a client-specific recipe.

At a next step 104, processing data are collected by a set of sensors (e.g., pressure sensor, temperature sensor, VI probe, OES, Langmuir probe, and the like).

At a next step 106, a model is applied to the processing data. In other words, the system may compare the processing data against a multi-variate predictive model. In an embodiment, the predictive model is a statistical model. In another embodiment, the predictive model is an electrical model. In yet another embodiment, the predictive model is a plasma model. Further, step 106 is not limited to analyzing one component. Instead, different multi-variate predictive models may be applied toward the same data set to analyze the health of different components.

In an embodiment, the multi-variate predictive model may be pulling data from a library (108). The library may include data (e.g., constants) that may be employed to support the model.

After the analysis has been performed, at a next step 110, the predictive model may output component wear data for each component being analyzed. In other words, a data report may be produced detailing the health state of each component being analyzed At a next step 112, the system may compare the outputted data against a useful life threshold range. The useful life threshold for each component may be based on expert knowledge, for example. In an embodiment, the useful life threshold may be user configurable. Thus, the user may modify the useful life threshold to adjust for tool's configurations, recipe configurations, and the like.

If the outputted data is outside of the useful life threshold, then at a next step 114, a warning/error message may be provided. The warning/error message may identify the parameters that have caused the useful life threshold to be violated. With the data from the output report, the user (e.g., process engineer) may proceed with confidence in determining the course of action that may be required to rectify the problem. In an example, the component may have to be repaired and/or replaced, for example.

If the outputted data is within the useful life threshold, then each component that is being analyzed is deemed to be in good working condition. At a next step 116, the system may wait for the next measurement interval before performing the method as described in FIG. 1 again.

As can be appreciated from FIG. 1, by applying the multi-variate model, a user may be able to determine the health of one or more components. Thus, the predictive model may not only identify when a component has deteriorated but may also predict when the component may wear out to the point of unacceptability. In an example, the output report does not show that the edge ring is worn out since the edge ring may still be working properly. However, the output report may show that about 75 percent of the useful life of the edge ring has been consumed and the edge ring may need to be replaced soon. With this knowledge, the manufacturing company may plan for the upcoming repairs.

Figure 2:
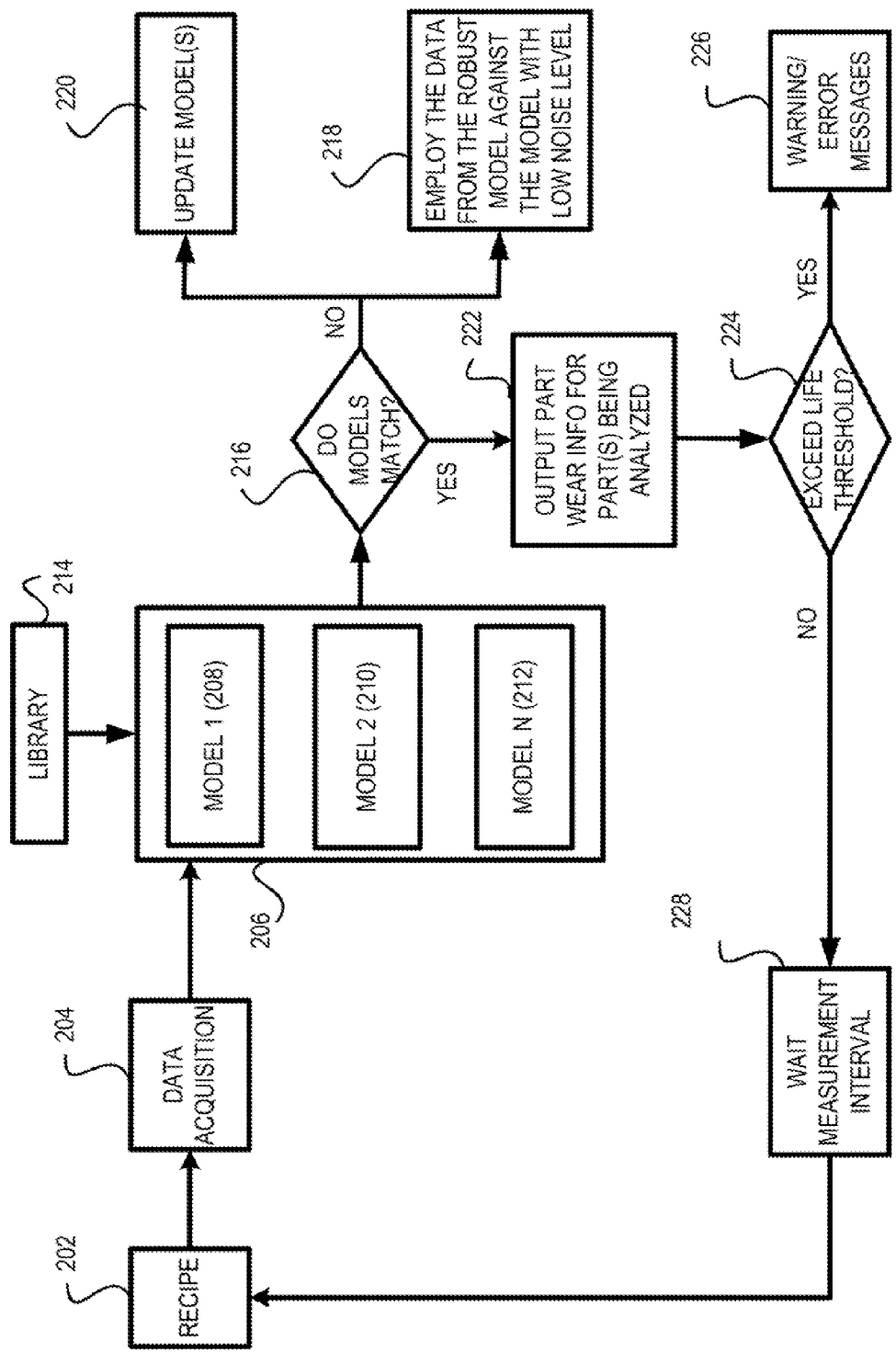
FIG. 2 shows, in an embodiment, a simple flow chart illustrating a method for applying multiple predictive models in determining the health of a component.

FIG. 2 shows, in an embodiment, a simple flow chart illustrating a method for applying multiple predictive models in determining the health of a component.

At a first step 202, a recipe is executed in a processing chamber. Similar to FIG. 1, the recipe may be either a client-specific recipe, a WAC recipe, or a non-client specific recipe.

At a next step 204, processing data are collected by a set of sensors (e.g., pressure sensor, temperature sensor, VI probe, OES, Langmuir probe, and the like).

At a next step 206, a set of models is applied to the processing data. In other words, two or more models (208, 210, and 212) may be employed to analyze the processing data. In an example, two models may be applied toward qualifying the component. For example, model 208 may be a multi-variate statistical model while model 210 may be an electrical model.

Similar to FIG. 1, step 206 allows for different predictive models to be applied toward the same data set to analyze the health of different components.

In an embodiment, the set of models may be pulling data from a library (214). The library may include data (e.g., constants) that may be employed to support the models.

After the analysis has been performed, at a next step 216, the system may check to determine if the outputs from the models match. In an example, if the output from multi-variate model 208 shows a 90 percent wear on the component while the output from multi-variate model 210 shows a 75 percent wear for the same component, then the outputted data from the models do not match.

If the outputted data from the models do not match, then at a next step 218, the model with less noise may be applied to the data from the more robust model. In an example, model 208 may be an electrical model and may be a more robust model but may have a very high noise level. However, model 210 may be a statistical model and may be less robust but may have a lower noise level. As discussed herein, a robust model refers to a model that has few outliers (statistical anomalies). In an embodiment, a less robust but lower noise model (model 210) may be applied to the data from the more robust model (in this example, model 208) to qualify the component. This method allows for the reduction of noise while increasing accuracy.

Additionally, since the outputs of the models do not match, the system may also report the differences and mark the models for updates (step 220). In other words, additional data may be gathered to reconstruct one or more of the models. In an example, the method described in FIG. 5 (which will be discussed later) may be performed to reconstruct (with different/additional data or different modeling approaches) the electrical model (208) and the statistical model (210) in order to adjust the noise level to better correlate the models.

However, if the data output from the models match, then at a next step 222, the predictive models may output component wear data for the component being analyzed.

At a next step 224, the system may compare the outputted data against a useful life threshold range.

If the useful life threshold is exceeded, then at a next step 226, a warning/error message may be provided.

If the outputted data is outside of the useful life threshold, then at a next step 228, the system may wait for the next measurement interval.

As can be appreciated from FIG. 2, the method described in FIG. 2 is somewhat analogous to the method describe in FIG. 1 except that instead of a single multi-variate predictive model, the method as described in FIG. 2 utilizes a plurality of predictive models. By utilizing more than one predictive model, validation may be provided. Also, if one of the models is less robust, the additional models may be employed to supplement the less robust model.

Figure 3:
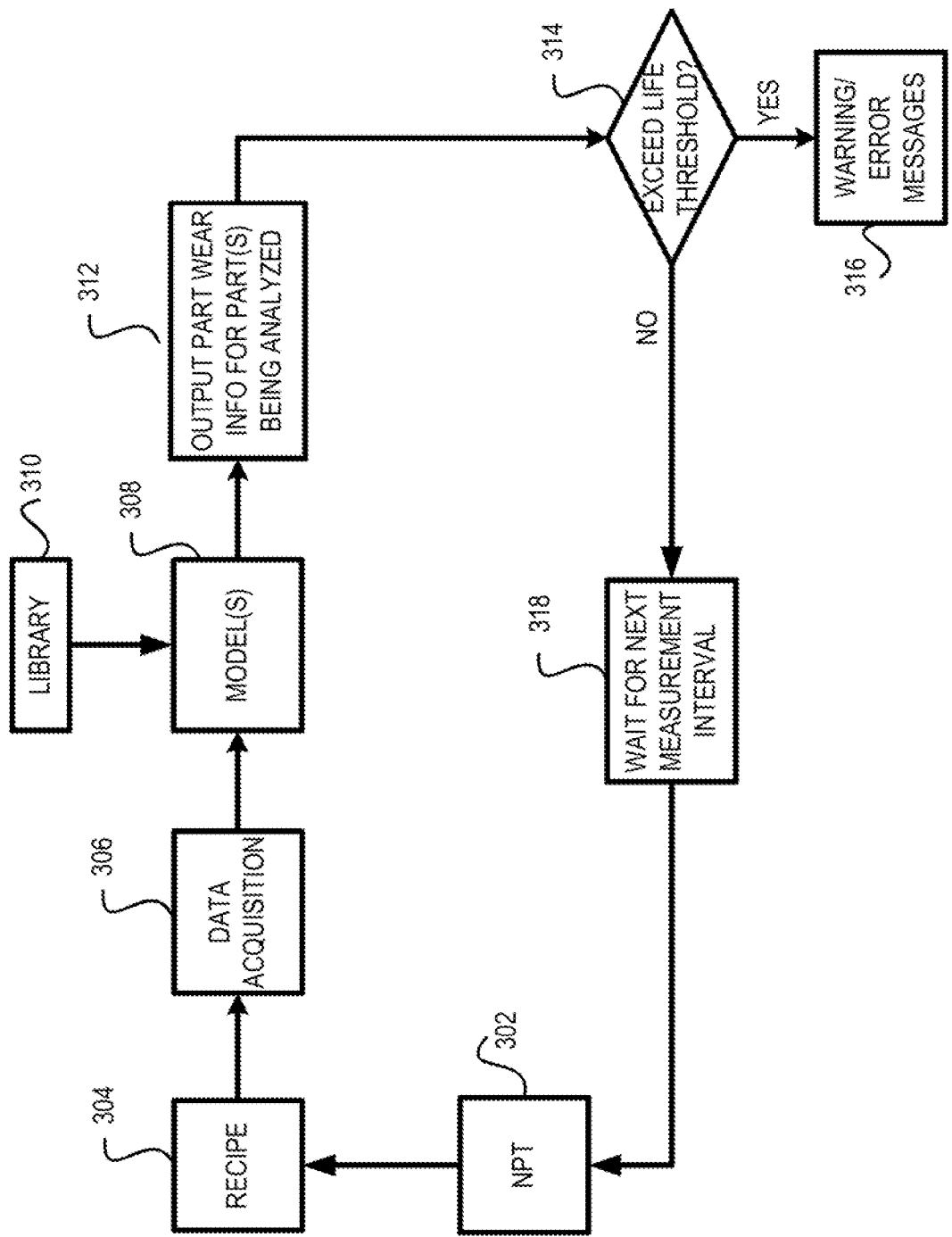
FIG. 3 shows, in an embodiment of the invention, a simple flow chart illustrating a method for applying a multi-variate predictive model with a non-plasma test (NPT).

FIG. 3 shows, in an embodiment of the invention, a simple flow chart illustrating a method for applying a multi-variate predictive model with a non-plasma test (NPT).

At a first step 302, a non-plasma test is run. As discussed herein, a non-plasma test refers to a quick test that may be executed by sending low power at predefined frequencies into the processing chamber. The power may not be strong enough to strike a plasma but is sufficient to provide electrical data (e.g., impedance, capacitance, etc.) about the chamber. In an embodiment, the non-plasma test may be a precursor for a chamber health index test. In other words, if the NPT shows that a potential problem may exist with one of the components, a chamber health index may be executed. Since the NPT is a quick and fairly inexpensive test in comparison to the chamber health index test, using the NPT as a precursor may help reduce the ownership cost.

If the NPT indicates that a potential problem may exist, then at a next step 304, the chamber health index test may be performed. To initiate the chamber health index test, a recipe may first be executed.

At a next step 306, data is acquired for analysis.

At a next step 308, one or more models may be applied toward the data for analysis (see discussion of FIGS. 1 and 2).

To perform the analysis, data may also be pulled from a library 310. The library may include data (e.g., constants) that may be employed to support the model(s).

Once data analysis has been completed, an output report may be provided about the health of each of the components being analyzed (step 312)

At a next step 314, the system may compare the outputted data against a useful life threshold range. The useful life threshold for each component may be based on expert knowledge, for example. In an embodiment, the useful life threshold may be user configurable. Thus, the user may modify the useful life threshold to adjust for tool's configurations, recipe configurations, and the like.

If the outputted data is outside the useful life threshold range, then at a next step 316, a warning/error message may be provided. The warning/error message may identify the parameters that have caused the useful life threshold to be violated. With the data from the output report, the user (e.g., process engineer) may proceed with confidence in determining the course of action that may be required to rectify the problem. In an example, the component may have to be repaired and/or replaced, for example.

If the outputted data is within the useful life threshold range, then at a next step 318, the system may wait for the next measurement interval.

As can be appreciated from FIG. 3, the steps for qualifying a component is somewhat analogous to the steps described in FIG. 1 and/or FIG. 2. Unlike FIG. 1 and/or FIG. 2, the method as described in FIG. 3 pertains to a quantitative method for identifying the next measurement interval. In other words, the NPT is utilized as an indicator of when the next chamber health index test may have to be performed. As can be appreciated from the foregoing, the steps as described in FIG. 3 may be adjusted if more than one multi-variate predictive model is employed in analyzing the data.

Figure 4:
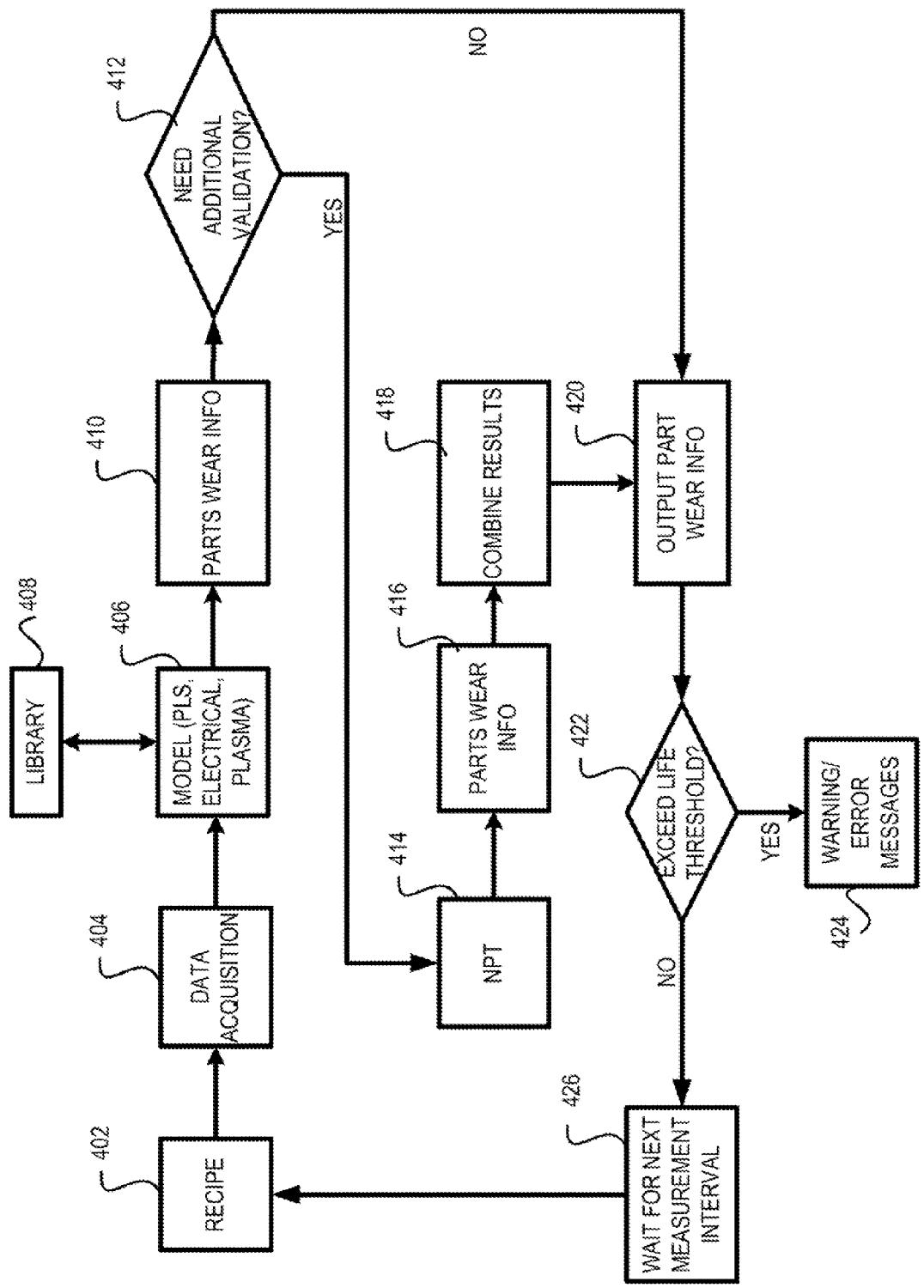
FIG. 4 shows, in an embodiment of the invention, a simple flow chart illustrating a method for qualifying a component using a multi-variate predictive model and data from a non-plasma test.

FIG. 4 shows, in an embodiment of the invention, a simple flow chart illustrating a method for qualifying a component using a multi-variate predictive model and data from a non-plasma test. Although both FIG. 3 and FIG. 4 utilize a non-plasma test, the method described in FIG. 4 is different from the method described in FIG. 3 in that the NPT is utilized for validation instead of as a precursor to a chamber health index test.

At a first step 402, a recipe is executed.

At a next step 404, processing data is acquired during processing.

At a next step 406, one or more models may be applied to the data for analysis. In an embodiment, data may also be pulled from a library 408.

The results from the analysis are provided as an output report (Step 410).

At a next step 412, the system may analyze the result to determine additional validation is required. Additional validation may be required when the result from step 410 is uncertain or has too much noise. In an embodiment, the result may be compared against a predefined noise level threshold range. If the result is outside of the predefined noise level threshold range, validation may be required.

If additional validation is required, then at a next step 414, an NPT may be executed.

During the NPT, data is collected (step 416).

The data from the NPT and the model analysis are correlated with the NPT data being utilized to validate the data collected during the model analysis (step 418)

The combined data are outputted as a single report detailing the health of the component(s) being analyzed (step 420).

Of course, if no additional validation is needed (at step 412), then the part wear information (from step 410) may be outputted as a single report (step 420)

At a next step 422, the system may compare the outputted data against a useful life threshold range. The useful life threshold for each component may be based on expert knowledge. In an embodiment, the useful life threshold may be user configurable. Thus, the user may modify the useful life threshold to adjust for tool's configuration, recipe configuration, and the like.

If the outputted data is outside of the useful life threshold range, then at a next step 424, a warning/error message may be provided. The warning/error message may identify the parameters that have caused the useful life threshold to be violated. With the data from the output report, the user (e.g., process engineer) may proceed with confidence in determining the course of action that may be required to rectify the problem. In an example, the component may have to be repaired and/or replaced, for example.

If the outputted data is within the useful life threshold range, then at a next step 426, the system may wait for the next measurement interval.

As can be appreciated from FIG. 4, a robust method is provided for qualifying a component. Not only does the robust method provides for more than one multi-variate model to perform component analysis but also includes a NPT to validate the result of the multi-variate predictive model(s).

Figure 5:
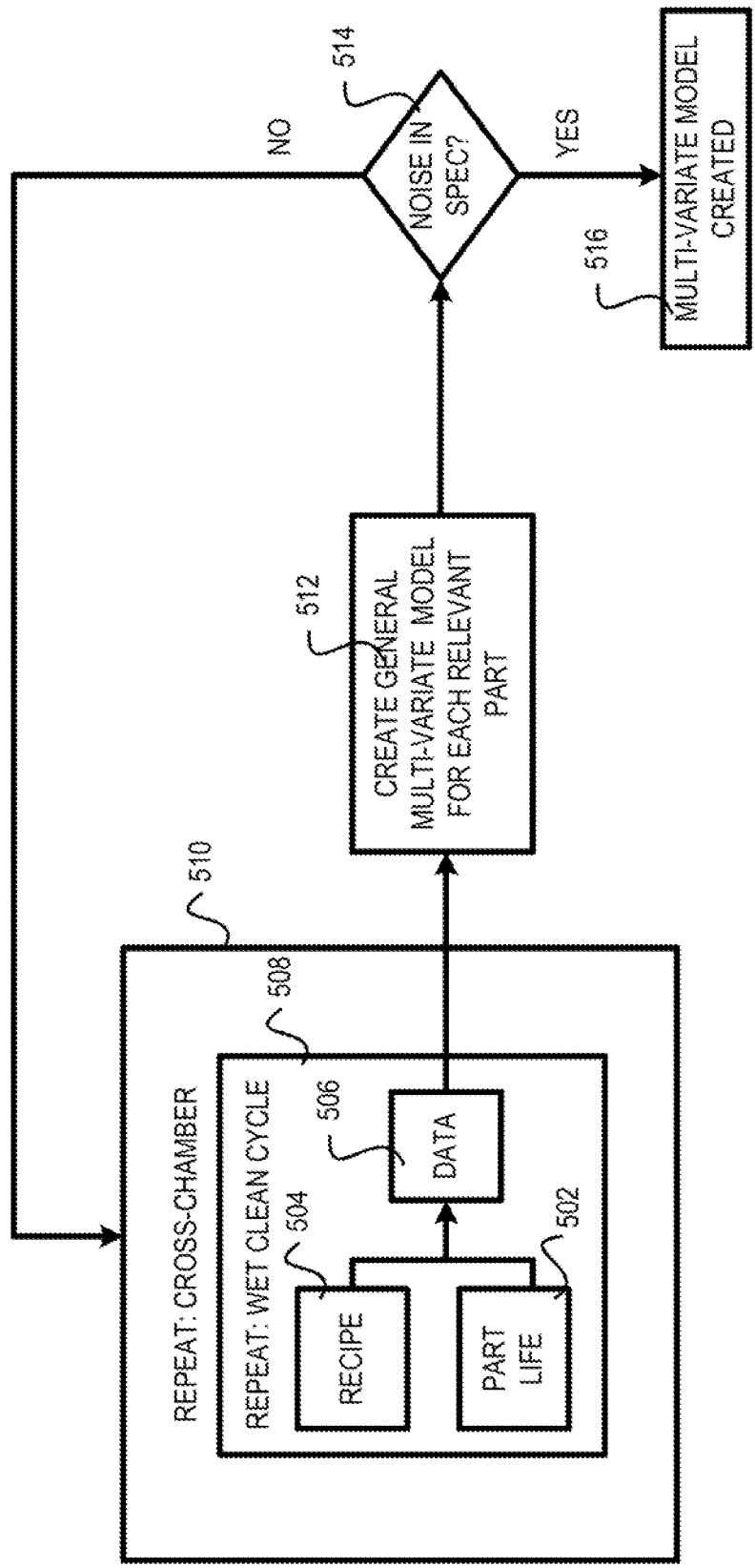
FIG. 5 shows, in an embodiment of the invention, a simple flow chart illustrating a method for constructing a multi-variate predictive model for qualifying a component.

As can be appreciated from the foregoing, the methods for accessing a chamber health status may be model-based approaches. Model-based approaches, in an embodiment, may be based on electrical models, plasma model, statistical model, or a hybrid model. To illustrate how a model may be constructed, FIG. 5 shows, in an embodiment of the invention, a simple flow chart illustrating a method for constructing a multi-variate predictive model for qualifying a component.

At a first step 502, component life data is provided. The component life data may include the functional and/or physical measurements for the components. In an example, if the component is brand new, the physical measurement is usually provided by the manufacturer. However, if the component is not new, then the component life may be determined by taking actual measurement of the components.

At a next step 504, a recipe is executed. The recipe may be a client-specific recipe, a non-client specific recipe, a WAC (waferless autoclean) recipe, for example.

Depending upon the requirements as set by the user (e.g., process engineer), one or more of the aforementioned recipe types may be executed in order to acquire the data necessary to create the model for qualifying a component of a processing chamber.

At a next step 506, processing data is collected during processing. The processing data may be captured by a set of sensors. As can be appreciated from the foregoing, the number of sensors available, the type of sensors available, and the specification of the sensors may impact the amount and granularity of processing data collected. Examples of sensors that may be employed within a processing chamber include but are not limited to, for example, pressure sensor, temperature sensor, voltage-current probe (VIP), optical emission spectroscopy (OES), and the like. Specifically, the data from the VIP and OES may involve discretizing the broadband output at specific frequencies or their harmonics. Alternately, comparison of the full broadband spectrum from these sensors could be the basis for analysis.

In an embodiment, steps 504 and 506 may be executed at different time intervals during a wet clean cycle in order to account for potential drill that may occur during a wet clean cycle. For example, the steps may be run when the component, such as an edge ring, has just been installed. The steps may also be repeated toward the middle and the end of the wet clean cycle. The amount of data available to construct the multi-variate model depends on the number of times that steps 504 and 506 are executed. As can be appreciated from the foregoing, the number of times that steps 504 and 506 may be executed may depend upon the benefit that the user may derive from the additional data in constructing the model.

Since the parameters may change after a maintenance event (e.g., wet clean) is performed, parameters that are affected by a wet clean may need to be identified and eliminated or conditioned before constructing the multi-variate model. In an example, after the transparent window of a processing chamber is cleaned, the measured intensity at some wavelengths (by an OES) may change. In order to eliminate the parameters that may be affected by a wet clean, steps 504 and 506 may have to be executed multiple times across a wet clean cycle (508), in an embodiment.

Additionally or alternatively, steps 502-506 may also be executed across processing chambers (510). In order to create a multi-variate model that may be applied across processing chambers (given the same/similar chamber conditions), parameters that may be affected by chamber-related condition may have to be identified and eliminated or conditioned. For example, the data collected during execution of a standard qualifying recipe run on the different process chambers can be used to develop rules for transforming sensor outputs from one chamber to another, thus matching the outputs on both chambers.

In an embodiment of the invention, if the sensors are matched then steps 502-506 may not have to be repeated across a wet clean cycle and/or processing chambers in order to eliminate changes to parameters that may not be related to component wear. Matched sensors should return the same absolute value for some defined chamber state. Measured chamber impedance for two identical chambers will be the same if two matched sensors are used.

Once sufficient data has been collected, a multi-variate model may be created for the component, at a next step 512. Unlike the prior art, the multi-variate model is based on a plurality of parameters instead of a single parameter. Since a high volume of data and/or highly granular data may be collected by the sensors, a fast processing computing module may be employed to handle the data processing and analysis, in an embodiment. To increase processing time, the data may be sent directly from the sensors to the fast processing computing module without first having to go through the fabrication facility host controller or even the process module controller. Application Ser. No. 12/555,674, filed on Sep. 8, 2009, by Huang et al. describes an example of the fast processing computing module suitable for handling data.

However, not all data collected may be relevant to the process of qualifying a component. In order to identify only parameters that may be related to component wear, filtering criteria may be applied. The filtering criteria, in an embodiment, may include parameters not related to a wet clean cycle. In another embodiment, filtering criteria may also include excluding data that are chamber dependent. As an example, when using a VI probe to monitor a specific 27 MHz plasma across a wet clean, some harmonic content greater than 100 MHz will often shift even after closely tracking parts wear internally to a wet clean.

Once the relevant parameters related to component wear have been identified, one or more models may be constructed. In an embodiment, the processing data may be utilized to create a statistical model, an electrical model and/or a plasma model. As an example, the same data can be used to construct wear information models for multiple chamber parts. Linearly decoupling part wear can be accomplished by replacing parts or by using a complex multi-step plasma process such that only specific parts are monitored by each plasma.

After each model has been created, the system may check to determine if the noise level within the model is acceptable (step 514). The noise may be coming from the physical measurements and/or the inherent noise within the sensors, for example.

In an example, noise may exist due to component-to-component variation. In other words, component characteristics may vary due to the size of the component, the material composition of the component, the configuration of the component, and the like. In an example, the edge ring inside processing chamber A and processing chamber B may seem to be the same. However, the size of the edge ring in processing chamber A may be slightly larger than the one in processing chamber B. Since the component-to-component variation may be identified, the component-to-component variation may be accounted for in the model. In an embodiment, an acceptable threshold range is defined. If the component-to-component variation is outside the threshold range, the system may have to acquire additional data in order to construct the model.

Another source for noise may be due to the installation of the component. In an example, the placement of the edge ring may cause noise within the model. For example, a gap may exist between the edge ring and the electrostatic chuck. However, if this gap varies among processing chambers, the electrical characteristic of the processing chambers may vary. For this reason, a threshold range may be established. If the difference is outside of the threshold range, additional data may be acquired in order to construct the model.

At a next step 516, the construction of the multi-variate model is completed.

Steps 502-516 may be performed to create one or more multi-variate predictive models for a single component. Of course, the same data file may be employed to create multi-variate predictive models for other components.

As can be appreciated from FIG. 5, the method described provides for the creation of a multi-variate predictive model that may take into account conditions of a component across different environmental conditions, such as within a wet clean cycle, across wet clean cycles, and within different processing chambers. By collecting data in different conditions, non-component wear related data may be eliminated. Thus, with a predictive model, the user is able to optimize parts usage, reduce wafer scrap, and predict upcoming replacement events and plan for upcoming repairs, thereby reducing the cost of ownership.

As can be appreciated from the foregoing, methods are provided for performing a health check on components within a processing chamber. By employing one or more multi-variate predictive models, a more accurate analysis of the components is provided. In other words, by utilizing data from multiple sensors, the chamber health index test may be employed to estimate and/or predict the remaining useful lifetime of components without the need for external metrology measurements. With more granular and less intrusive chamber health index checks, a more cost effective method is provided for identifying the state of the components. Thus, the cost of ownership is reduced as fewer resources and/or components are wasted and/or damaged.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for assessing health status of a processing chamber, comprising:
executing a recipe;
receiving processing data from a set of sensors during execution of said recipe;
analyzing said processing data utilizing a set of multi-variate predictive models;
generating a set of component wear data values;
comparing said set of component wear data values against a set of useful life threshold ranges; and
generating a warning if said set of component wear data values is outside of said set of useful life threshold ranges, wherein said processing data is analyzed by employing at least two different multi-variate predictive models of said set of multi-variate predictive model, wherein said processing data is analyzed by employing a first multi-variate predictive model to generate a first set of component wear data values and employing a second multi-variate predictive model to generate a second set of component wear data values, if differences exist between said first set of component wear data values and said second set of component wear data values, applying said second multi-variate predictive model to said first set of component wear data values, wherein said first set of component wear data values has less noise than said second set of component wear data values.

2. The method of claim 1 further including pulling data from a library to support said set of multi-variate predictive models.

3. The method of claim 2 wherein said recipe includes one of a client-specific recipe, a non-client specific recipe, and a waferless clean autoclean recipe.

4. The method of claim 2 wherein said set of multi-variate predictive models includes at least one of an electrical model, a statistical model, and a plasma model.

5. The method of claim 2 wherein said set of multi-variate predictive models is configured to analyze more than one consumable part, wherein each consumable part is associated with one useful life threshold range of said set of useful life threshold ranges.

6. The method of claim 2 wherein said set of useful life threshold ranges is user-configurable.

7. The method of claim 2 further including performing said assessing of said health status of said processing chamber after a measurement interval, wherein said measurement interval is determined by one of a predefined period of time and by executing a non-plasma test.

8. The method of claim 2 further including analyzing said set of component wear data values to determine if validation is required, wherein said validation occurs when said set of component wear data values is outside of a noise level threshold range;
   executing a non-plasma test to validate said set of component wear data values; and
   correlating said set of component wear data values against a set of non-plasma test data values to generate a combined set of component wear data values, wherein said combined set of component wear data values is compared against said set of useful life threshold range and said warning is generated if said combined set of component wear data values is outside of said set of useful life threshold range.

9. An article of manufacture comprising a program storage medium having computer readable code embodied therein, said computer readable code being configured for assessing health status of a processing chamber, comprising:
   code for executing a recipe;
   code for receiving processing data from a set of sensors during execution of said recipe;
   code for analyzing said processing data utilizing a set of multi-variate predictive models;
   code for generating a set of component wear data values;
   code for comparing said set of component wear data values against a set of useful life threshold ranges;
   code for generating a warning if said set of component wear data values is outside of said set of useful life threshold ranges, wherein said code for analyzing said processing data includes code for utilizing at least two different multi-variate predictive models of said set of multi-variate predictive model;
   code for pulling data from a library to support said set of multi-variate predictive models;
      code for analyzing said set of component wear data values to determine if validation is required, wherein validation occurs when said set of component wear data values is outside of a noise level threshold range;
   code for executing a non-plasma test to validate said set of component wear data values; and
   code for correlating said set of component wear data values against a set of non-plasma test data values to generate a combined set of component wear data values, wherein said combined set of component wear data values is compared against said set of useful life threshold range and said warning is generated if said combined set of component wear data values is outside of set of useful life threshold range.

10. The article of manufacture of claim 9 further including code for performing said assessing of said health status of said processing chamber after a measurement interval, wherein said measurement interval is determined by one of a predefined period of time and by executing a non-plasma test.

11. The article of manufacture of claim 9 wherein said recipe includes one of a client-specific recipe, a non-client specific recipe, and a waterless clean autoclean recipe.

12. The article of manufacture of claim 9 wherein said code for analyzing said processing data includes code for utilizing a first multi-variate predictive model of said set of multi-variate predictive model.

13. The article of manufacture of claim 9 wherein said set of multi-variate predictive models includes at least one of an electrical model, a statistical model, and a plasma model.

14. An article of manufacture comprising a program storage medium having computer readable code embodied therein, said computer readable code being configured for assessing health status of a processing chamber, comprising;
   code for executing a recipe;
   code for receiving processing data from a set of sensors during execution of said recipe;
   code for analyzing said processing data utilizing a set of multi-variate predictive models;
   code for generating a set of component wear data values;
   code for comparing said set of component wear data values against a set of useful life threshold ranges;
   code for generating a warning if said set of component wear data values is outside of said set of useful life threshold ranges, wherein said code for analyzing said processing data includes code for utilizing at least two different multi-variate predictive models of said set of multi-variate predictive model, wherein said code for analyzing said processing data includes code for utilizing at least two multi-variate predictive models of said set of multi-variate predictive model, and
   wherein code for analyzing said processing data includes code for utilizing a first multi-variate predictive model to generate a first set of component wear data values and code for utilizing a second multi-variate predictive model to generate a second set of component wear data values, if differences exist between said first set of component wear data values and said second set of wear data values, code for applying said second multi-variate predictive model to said first set of component wear data values, wherein said second multi-variate predictive model has less noise than said first multi-variate predictive model.

15. A method for assessing health status of a processing chamber, comprising: executing as recipe;
   receiving processing data from a set of sensors during execution of said recipe;
   analyzing said processing data utilizing a set of multi-variate predictive models;
   generating a set of component wear data values;
   comparing said set of component wear data values against a set of useful life threshold ranges;
   generating a warning if said set of component wear data values is outside of said set of useful life threshold ranges, wherein said processing data is analyzed by employing at least two different multi-variate predictive models of said set of multi-variate predictive model;
   pulling data from a library to support said set of multi-variate predictive models;
   analyzing said set of component wear data values to determine if validation is required, wherein said validation occurs when said set of component wear data values is outside of a noise level threshold range;
   executing a non-plasma test to validate said set of component wear data values; and
   correlating said set of component wear data values against a set of non-plasma test data values to generate a combined set of component wear data values, wherein said combined set of component wear data values is compared against said set of useful life threshold range and said warning is generated if said combined set of component wear data values is outside of said set of useful life threshold range.

16. The method of claim 15 wherein said recipe includes one of a client-specific recipe, a non-client specific recipe, and a waferless clean autoclean recipe.

17. The method of claim 15 wherein said set of multivariate predictive models includes at least one of an electrical model, a statistical model, and a plasma model.

18. The method of claim 15 wherein said set of multivariate predictive models is configured to analyze more than one consumable part, wherein each consumable part is associated with one useful life threshold range of said set of useful life threshold ranges.

* * * * *